(12) United States Patent
Arunagiri et al.

(10) Patent No.: US 9,459,878 B2
(45) Date of Patent: *Oct. 4, 2016

(54) VERIFYING FORWARDING PATHS IN PIPELINES

(71) Applicant: International Business Machines Corporation, Armonk, NY (US)

(72) Inventors: Anand B. Arunagiri, Bangalore (IN); Udo Krautz, Esslingen (DE); Sujeet Kumar, Bangalore (IN); Viresh Paruthi, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 267 days.

This patent is subject to a terminal disclaimer.

(21) Appl. No.: 14/150,974

(22) Filed: Jan. 9, 2014

(65) Prior Publication Data

US 2015/0058604 A1 Feb. 26, 2015

Related U.S. Application Data

(63) Continuation of application No. 13/970,715, filed on Aug. 20, 2013.

(51) Int. Cl.
*G06F 11/00* (2006.01)
*G06F 9/455* (2006.01)
(Continued)

(52) U.S. Cl.
CPC ............ *G06F 9/3869* (2013.01); *G06F 11/16* (2013.01); *G06F 11/263* (2013.01); *G06F 11/3664* (2013.01); *G06F 11/3684* (2013.01); *G06F 11/3636* (2013.01)

(58) Field of Classification Search
CPC ............... G06F 9/3836; G06F 9/3869; G06F 11/3664; G06F 11/3684; G06F 11/3636; G06F 11/16; G06F 11/263

USPC ................... 712/216, 227; 717/135
See application file for complete search history.

(56) References Cited

U.S. PATENT DOCUMENTS 5,734,908 A * 3/1998 Chan et al. .................. 717/154
7,089,534 B2 * 8/2006 Hartman et al. ............. 717/125
(Continued)

FOREIGN PATENT DOCUMENTS

EP 2088521 B1 2/2008

OTHER PUBLICATIONS

Aharony, et al., "Injecting floating-point testing knowledge into test generators", HVC'11 Proceedings of the 7th international Haifa Verification conference on Hardware and Software: verification and testing, pp. 234-241, Springer-Verlag Berlin, Heidelberg, © 2012, <http://dx.doi.org/10.1007/978-3-642-34188-5_20>.

(Continued)

*Primary Examiner* — Daniel Pan
(74) *Attorney, Agent, or Firm* — Maeve M. Carpenter

(57) ABSTRACT

A tool for formally verifying forwarding paths in an information pipeline. The tool creates two logic design copies of the pipeline to be verified. The tool retrieves a first and a second instruction, which have previously been proven to compute a mathematically correct result when executed separately. The tool defines driver input functions for issuing instructions to the two logic design copies. In accordance with the driver input functions, the tool issues instructions to the two logic design copies. The tool abstracts data flow of the two logic design copies to isolate forwarding paths for verification. The tool adjusts for latency differences between the first and second logic design copies. The tool checks a register for results, and when results from of two logic design copies become available in the register, the tool verifies the results to conclusively prove the correctness of all states of the information pipeline.

4 Claims, 3 Drawing Sheets

(51) Int. Cl.
  *G06F 9/38*    (2006.01)
  *G06F 11/36*   (2006.01)
  *G06F 11/16*   (2006.01)
  *G06F 11/263*  (2006.01)

(56) References Cited

U.S. PATENT DOCUMENTS

| | | |
|---|---|---|
| 7,302,656 B2 | 11/2007 | Weber et al. |
| 7,725,687 B2* | 5/2010 | Menon et al. ............... 712/218 |
| 7,752,583 B2 | 7/2010 | Baumgartner et al. |
| 7,890,903 B2 | 2/2011 | Weber et al. |
| 8,271,955 B1* | 9/2012 | Lindahl et al. ............... 717/128 |
| 8,359,561 B2 | 1/2013 | Bormann et al. |
| 2004/0117172 A1* | 6/2004 | Shibata ............................ 703/22 |
| 2005/0125786 A1* | 6/2005 | Dai et al. ....................... 717/161 |
| 2007/0186197 A1 | 8/2007 | Lu |
| 2009/0210656 A1* | 8/2009 | Hutton et al. ................... 712/30 |
| 2015/0058601 A1* | 2/2015 | Arunagiri et al. ............. 712/216 |

OTHER PUBLICATIONS

Shehata, Hazem, "Formal Verification of Instruction Dependencies in Microprocessors", A thesis presented to the University of Waterloo in fulfillment of the thesis requirement for the degree of Doctor of Philosophy in Electrical and Computer Engineering, Waterloo, Ontario, Canada, 2011, © Hazem Shehata 2011, pp. 1-137.

U.S. Appl. No. 13/970,715, filed Aug. 20, 2013.

* cited by examiner

VERIFYING FORWARDING PATHS IN PIPELINES

CROSS REFERENCE TO RELATED APPLICATION

This application is a Continuation Application of pending U.S. patent application Ser. No. 13/970,715 filed Aug. 20, 2013.

FIELD OF THE INVENTION

The present invention relates generally to the field of instruction processing and more particularly to verifying forwarding paths in pipelines.

BACKGROUND OF THE INVENTION

A pipeline is a set of data processing elements connected in a series, where the output of one element is the input of the next one. Pipelining optimizes processor functionality by keeping all portions of the processor occupied, thus increasing the amount of useful work the processor can do in a given time. Pipelining typically reduces the processor's cycle time and increases the throughput (the number of instructions that can be executed in a unit of time, otherwise known as a clock cycle) of instructions. Elements of a pipeline are often executed in parallel to allow overlapping execution of multiple instructions with the same circuitry. Logic circuits are usually divided up into stages, including instruction decoding, arithmetic, and register fetching stages, wherein each stage processes one instruction at a time.

In microprocessors, achieving an efficient utilization of the execution units is a key factor in improving performance. However, maintaining uninterrupted flow of instruction is a challenge due to data and control dependencies between instructions of a program. Modern microprocessors employ aggressive optimizations trying to keep their execution units busy without violating inter-instruction dependencies. Such complex optimizations may cause subtle implementation bugs that can be hard to detect using conventional simulation-based verification techniques.

Formal verification is the act of using mathematical methods in proving or disproving the correctness of an implementation with respect to a certain specification, and a viable technique to cope with the increased complexity of hardware systems. In the context of hardware systems, the term implementation refers to a design description at any level of the hardware abstraction hierarchy, not only the final circuit layout. The term specification refers to the desired (correct) behavior of the design under consideration. Verification of these systems is done by providing a formal proof on an abstract mathematical model of the system, the correspondence between the mathematical model and the nature of the system being otherwise known by design.

The growth in complexity of hardware designs increases the importance of formal verification techniques in the hardware industry. This could be attributed to a greater need in the hardware industry, where errors can have devastating economic effects, to conclusively prove correctness of design architectures. Potential, subtle interactions between components make it increasingly difficult to exercise a realistic set of possibilities by simulation-based verification approaches. Formal verification can be helpful to conclusively prove correctness of systems by virtue of analysis of all the states, a coverage that is presently lacking in simulation-based approaches.

SUMMARY

Embodiments of the present invention disclose a method, system, and computer program product for formally verifying forwarding paths in a pipeline. A computer creates a first and a second logic design copy of an instruction pipeline, wherein the first logic design copy, without forwarding enabled, is driven in such a way that it executes a selected sequence of two instructions as independent instructions, and the second logic design copy, with forwarding enabled, is driven in such a way that it executes the selected sequence of two instructions as dependent instructions. A computer retrieving a first instruction and a second instruction, wherein the instructions have been previously proven to compute a mathematically correct result when executed separately. A computer system abstracting data flow of the two logic design copies of the instruction pipeline. A computer system adjusting for latency differences between the issuing of the second instruction in the first logic design copy and the issuing of the second instruction in the second logic design copy of the instruction pipeline. A computer system verifying correctness of a result of the second instruction in the first logic design copy to a result of the second instruction in the second logic design copy of the instruction pipeline.

DETAILED DESCRIPTION

Figure 1:
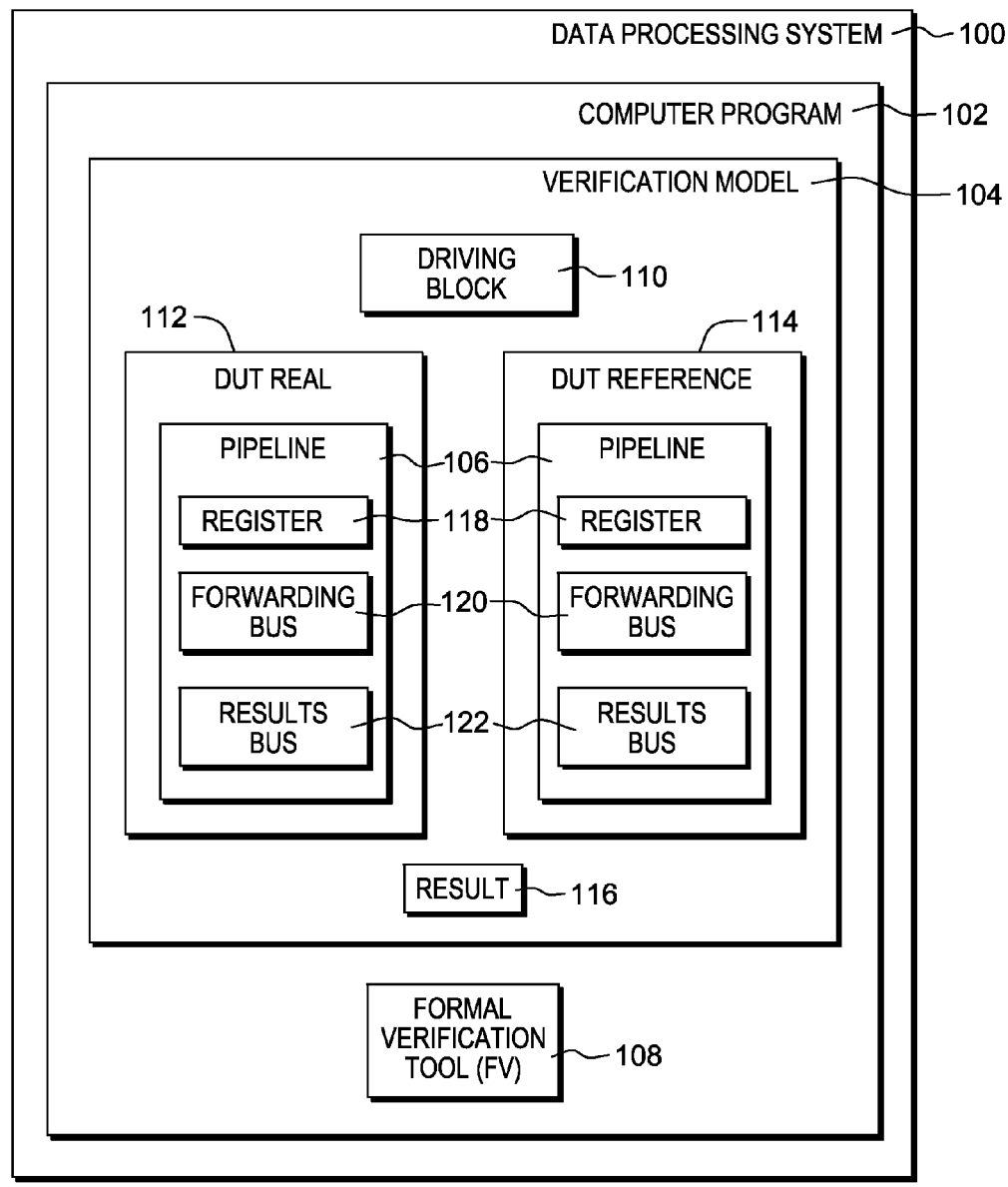
FIG. 1 is a functional block diagram illustrating a data processing system, in accordance with an embodiment of the present invention.

Embodiments of the present invention recognize that floating-point data flow and control cannot be verified exhaustively by simulation-based verification methods. A floating-point unit describes a method of representing an approximation of a real number in a way that can support a wide range of values. End-to-end model checking for floating-point units suffers from a significant limitation; verification is constrained to a single instruction being executed in a pipeline. Modern design architectures rely heavily on utilizing pipelines to increase throughput through a process called forwarding (feeding back the output of an instruction in a previous stage of the pipeline as soon as the output of that instruction is available), thereby introducing an additional dimension of complexity in the form of instruction sequences. Recent developments make control verification amenable by allowing sequences of instructions, thereby analyzing complex control as it relates to inter-instruction interactions and pipeline control. Presently, only sequences of independent instructions are covered. This is a major limitation as dependent instructions are utilized in a plurality of execution unit pipelines, including floating-point unit pipelines, to allow for greater throughput.

Embodiments of the present invention provide the capability to formally verify the correctness of forwarding implementations for dependent instructions by utilizing the concept of un-interpreted functions (UIFs) to obtain exhaustive coverage of all possible implementations, thereby guaranteeing the correctness of forwarding implementations by way of yielding full proofs.

Implementation of such embodiments may take a variety of forms, and exemplary implementation details are discussed subsequently with reference to the Figures.

As will be appreciated by one skilled in the art, aspects of the present invention may be embodied as a method, system, or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module," or "system." Furthermore, aspects of the present invention may take the form of a computer program product embodied in one or more computer-readable media having computer readable program code/instructions embodied thereon.

Any combination of computer-readable media may be utilized. Computer-readable media may be a computer-readable signal medium or a computer-readable storage medium. A computer-readable storage medium may be, for example, but is not limited to, an electronic, magnetic, optical, electromagnetic, infrared, or semiconductor system, apparatus, or device, or any suitable combination of the foregoing. More specific examples (a non-exhaustive list) of a computer-readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer-readable storage medium may be any tangible medium that can contain, or store, a program for use by or in connection with an instruction execution system, apparatus, or device.

A computer-readable signal medium may include a propagated data signal with computer-readable program code embodied therein, for example, in baseband or as part of a carrier wave. Such a propagated signal may take any of a variety of forms including, but not limited to, electro-magnetic, optical, or any suitable combination thereof. A computer-readable signal medium may be any computer-readable medium that is not a computer-readable storage medium and that can communicate, propagate, or transport a program for use by or in connection with an instruction execution system, apparatus or device.

Program code embodied on a computer-readable medium may be transmitted using any appropriate medium including, but not limited to, wireless, wireline, optical fiber cable, RF, etc., or any suitable combination of the foregoing.

Computer program code for carrying out operations for aspects of the present invention may be written in any combination of one or more programming languages, including an object oriented programming language such as Java®, Smalltalk, C++ or the like and conventional procedural programming languages, such as the "C" programming language or similar programming languages. The program code may execute entirely on a user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer, other programmable data processing apparatus, or other devices to function in a particular manner, such that the instructions stored in the computer-readable medium produce an article of manufacture including instructions that implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer-implemented process such that the instructions that execute on the computer or other programmable apparatus provide processes for implementing the functions/acts specified in the flowchart and/or block diagram block or blocks.

The present invention will now be described in detail with reference to Figures.

FIG. 1 illustrates a data processing system, generally designated 100, according to one embodiment of the present invention. Data processing system 100 includes a computer program 102.

Computer program 102 includes a verification model (VM) 104 and a formal verification tool (FV) 108. In an exemplary embodiment, computer program 102 is software capable of formally verifying forwarding paths in a logic design of an instruction pipeline, such as pipeline 106.

VM 104 includes a driving block 110, a device under test (real DUT) 112, a reference device under test (reference DUT) 114, and a result 116.

In the exemplary embodiment, driving block 110 includes a collection of functions that act on instruction inputs from structures in data processing system 100. Driving block 110 infers functional properties from structures within data processing system 100 (e.g. processors, memory, instruction cache, data cache, etc.). Functional properties of driving block 110 may ultimately be responsible for determining what happens in VM 104. In another embodiment, driving block 110 may comprise input functions that drive operations in VM 104. For example, driving block 110 drives the opcodes on the wires, operands on the wires, and signals to start issuing instructions to VM 104.

In the exemplary embodiment, VM 104 includes logic to create two logic design copies of, for example, pipeline 106 for isolating and verifying forwarding paths. For example, VM 104 comprises logic to formally verify the execution of a sequence of two dependent instructions in real DUT 112 to the execution of the same sequence of instructions, executed as independent instructions, in reference DUT 114.

In the exemplary embodiment, VM 104 includes logic to conclude the mathematical correctness of the forwarding implementation for the dependent instructions. For example, VM 104 utilizes the concept of un-interpreted functions (UIF) to yield full proofs guaranteeing correctness of the forwarding implementation. UIFs are considered to be random values, unspecified variables, or "free" functions that impose little or no restrictions.

In the exemplary embodiment, VM 104 replaces design artifacts (such as data stored on a data bus, logic, wires, latches, nodes, etc., but not any aspects of the control logic) in the two instances (real DUT 112 and reference DUT 114, respectively) with, for example, "black boxes." The black boxes function to abstract data-flow logic details that are irrelevant to the forwarding, thus greatly simplifying the logic to be analyzed, making the verification analysis amenable to full proofs.

Real DUT 112 and reference DUT 114 include a pipeline 106. In the exemplary embodiment, real DUT 112 and reference DUT 114 are structurally identical, however, real DUT 112 operates as an optimized pipeline with forwarding enabled, and reference DUT 114 operates as a non-optimized pipeline without forwarding enabled. For example, real DUT 112 and reference DUT 114 contain the same "target" pipeline to be verified, such as pipeline 106, but in each instance, instructions are driven in different ways.

In the exemplary embodiment, pipeline 106 represents an instruction pipeline capable of correctly executing a sequence of independent instructions. Pipeline 106 includes a register 118, a forwarding bus 120, and a results bus 122 organized in pipe stages. Pipeline 106 functions as a reference containing "correctness criteria," which may be utilized in verifying the correctness of forwarding paths. For example, pipeline 106 includes a set of data processing elements connected in series where the output of one element is the input of the next one. A function of pipeline 106 fetches instructions to be executed from an instruction cache. A function of pipeline 106 decodes instructions fetched from the instruction cache, and then a function of pipeline 106 executes those instructions in a series of stages. Pipeline 106 allows for multiple instructions to be processed in parallel. Instruction results are posted in results bus 122. Results bus 122 writes results to, for example, register 118. Forwarding bus 120 makes the result of one instruction available for a dependent instruction prior to that result being written to, for example, register 118.

In the exemplary embodiment, a formal verification tool (FV) 108 is software that works in conjunction with VM 104 to prove or disprove the correctness of the algorithms used to implement forwarding paths in a pipeline. FV 108 utilizes a deductive verification approach consisting of generating, from data processing system 100 and VM 104 (including DUT 114, which in and of itself defines "correctness criteria" based on an already known, correct way of computing the sequences as independent instructions), a collection of mathematical proof obligations, the truth of which imply conformance of the system to its specifications. For example, FV 108 may utilize result 116 produced by VM 104 during its operation, proof obligations generated by reference DUT 114, a collective total netlist, and other outputs recorded in a plurality of registers to formally verify correctness of the forwarding control of a pipeline. In one embodiment, FV 108 may be fully integrated with VM 104, partially integrated with VM 104, or entirely separate from VM 104.

Figure 2:
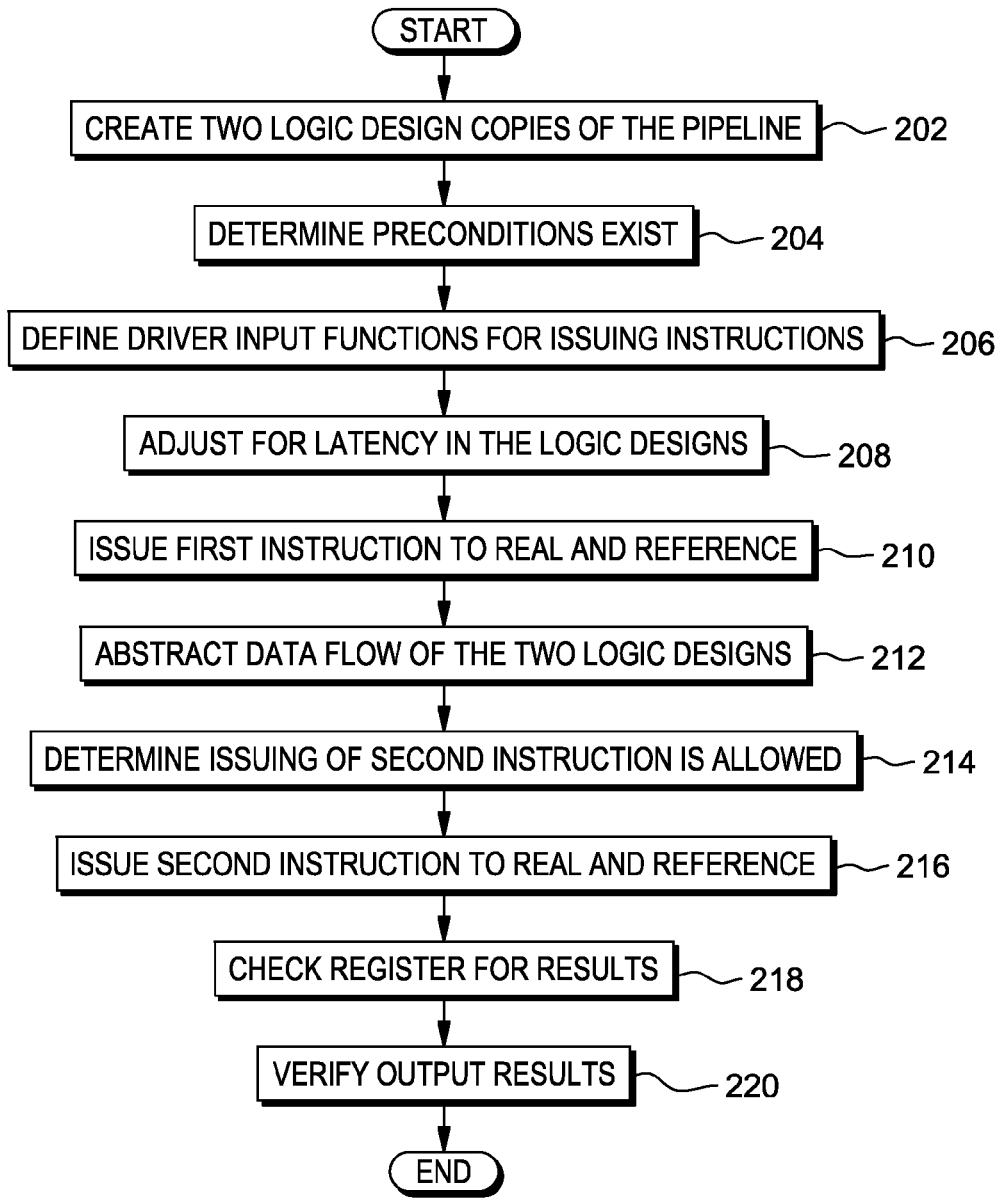
FIG. 2 is a flowchart depicting an exemplary process flow for formally verifying forwarding paths in a pipeline, in accordance with an embodiment of the present invention.

FIG. 2 depicts a flowchart of a process for formally verifying forwarding control in a logic design of a processor instruction pipeline, in accordance with one embodiment of the present invention.

To begin the process, VM 104 creates two logic design copies of a processor instruction pipeline (202). In the exemplary embodiment, VM 104 creates two copies of the same design logic of a processor instruction pipeline, for example, pipeline 106. The first logic design copy, reference DUT 114, a non-optimized "reference" model, executes the sequence of two instructions as independent instructions. More specifically, reference DUT 114 executes instructions without forwarding enabled. For example, in a non-optimized pipeline, the result of a first instruction has to be written and read from the register file prior to executing a second instruction. Therefore, the second instruction may be delayed until the result of the first instruction is available in the register file. The second copy of the design logic, real DUT 112, an optimized "real hardware" model, executes the second instruction as a dependent instruction. More specifically, real DUT 112 executes instructions with forwarding enabled. For example, in an optimized pipeline, the result of the first instruction initially bypasses the register file via a forwarding path, and becomes available for use by the second instruction prior to being written I to the register file. Therefore, little or no delay exists between the completion of the first instruction and the execution of the second instruction.

Upon receiving a selected sequence of two instructions to execute, VM 104 determines that certain preconditions exist to allow for verification of the forwarding control (204). In the exemplary embodiment, these preconditions include selecting a sequence of two instructions, one where the second instruction to be issued requires the result of the first instruction as an input operand. In this type of instruction sequence, the second instruction is considered dependent upon the first instruction. For example, if the first instruction was "A+B→C," the second, dependent instruction may be "C+D→E." The second instruction is dependent upon the first, since the output (result) of the first instruction, "C," is a necessary value in the performance of the second instruction.

Another precondition for verification of the forwarding control may be that both instructions in the selected sequence of two instructions must have previously proven to be implemented correctly in real DUT 112. Furthermore, when the two instructions are executed independently in the real DUT 112, the two instructions compute a mathematical correct result. For example, when the sequence of two instructions "A+B→C and then C+D→E" is executed, the result of "E" proves the mathematical correctness of the add instruction.

Driving block 110 defines input functions for issuing instructions to VM 104 (206). In the exemplary embodiment, driving block 110 utilizes the same hardware description language from, for example, the specification (architecture) of pipeline 106, to determine when to drive instructions for execution in VM 104. In another embodiment, driving block 110 may define an input function randomly. For example, a function may include a set of possible, randomized opcodes. The specification and format of opcodes may be laid out in the instruction set architecture (ISA) of the processor in question (which may be a general CPU or a more specialized processing unit). Apart from the opcode itself, an instruction may have one or more specifiers for operands (i.e., data) on which the operation should act, although some operations may have implicit operands or none at all. There may be instruction sets with nearly uniform fields for opcode and operand specifiers, as well as others with a more complicated, varied length structure. Depending on architecture, the operands may be register values, values in the stack, other memory values, I/O ports, etc., specified and accessed using more or less complex addressing modes. The types of operations may include arithmetic, data copying, logical operations, and program control, as well as special instructions. In allowing for randomness within the functions acting on VM 104, FV 108 may verify every possible element in the set, thereby achieving extended verification coverage.

Driving block 110 adjusts for latency in the two logic design copies of an instruction pipeline (208). In the exemplary embodiment, driving block 110 issues the first instruction to reference DUT 114 in an earlier clock cycle than real DUT 112. The difference in how much earlier reference DUT 114 receives the first instruction prior to DUT 112 will be equal to the number of clock cycles gained by forwarding in real DUT 112. For example, if it takes reference DUT 114 ten clock cycles to complete the sequence of instructions, and it takes real DUT 112 five clock cycles to complete the same sequence of instructions, then the first instruction may be issued to reference DUT 114 five clock cycles earlier than real DUT 112. The net effect is that reference DUT 114 and real DUT 112 may write their respective results in the register at exactly the same time. In another embodiment, driving block 110 may issue the first instruction in a sequence of dependent instructions to both reference DUT 114 and the real DUT 112, within VM 104, at the same time in the same clock cycle. Real DUT 112 and reference DUT 114 will complete the first instruction at the same time. However, real DUT 112, with forwarding enabled, will complete the second instruction earlier than reference DUT 114. In this case, driving block 110 may buffer the result of real DUT 112, for example, in a reorder buffer, for a period of time (equal to the number of clock cycles gained by the forwarding) prior to writing the result to the register. The purpose of buffering the result of DUT 112 is to time both results so they may arrive in the register at the same time. The timed arrival of both results in the register makes verification by FV 108 more efficient and easier to effectuate. Driving block 110 may obtain latency differences between reference DUT 114 and real DUT 112 from the design specification within data processing unit 100.

With respect to adjustments made, if any, in the two logic designs of VM 104, driving block 110 issues the first instruction of the selected sequence of dependent instructions to reference DUT 114 and real DUT 112 respectively (210).

Driving block 110 abstracts the data flow of reference DUT 114 and real DUT 112 in VM 104 to simplify verification of the forwarding control (212). Whether the intermediate result (result of the first instruction) is correct at this point in the logic design is not the focus for verification. Therefore, the logic of the first instruction can be abstracted to limit the amount of states that FV 108 analyzes. Abstracting the logic at this point achieves a reduction in the complexity of proofs to be verified by FV 108. In the exemplary embodiment, driving block 110 overrides, or "blackboxes," data flow logic with un-interpreted functions to reduce the logic to be analyzed by FV 108. Overriding the data flow logic with random values or variables eliminates areas of complexity which we are not concerned with for purposes of verification. For example, in reference DUT 114 and real DUT 112, driving block 110 may override outputs of the two logic design copies with random values, which are correlated across real DUT 112 and reference DUT 114, resulting in the same operands being supplied to the subsequent stage (the second instruction) with and without forwarding, respectively. Essentially, driving block 110 "clips the wires" on the output of the first instruction and inserts a variable on a data bus, overriding internal signals or outputs of the pipeline with a construct of every possible value on those signals. Overriding the data bus with unspecified values allows for more behavior on the bus. In response to more behavior on the bus, FV 108 considers every possible value that could be present, thereby obtaining exhaustive coverage of the proofs to be analyzed. Driving block 110 only overrides portions of the logic pertaining to data flow, and not any aspects of forwarding control. With data flow logic of the pipeline effectively axed, the forwarding control becomes transparent.

In the exemplary implementation, driving block 110 overrides data flow logic with random values by creating two copies of the blackboxed data flow logic. The two copies of the blackboxed data flow logic replace the design artifacts of the first instructions in reference DUT 114 (without forwarding) and real DUT 112 (with forwarding). The blackboxes supply the same output in both models when the same inputs are presented to the blackbox, enabling verification of the correctness of aspects of logic relating to forwarding while abstracting out irrelevant, complex logic details. The net effect reduces the logic to be analyzed to simply the forwarding logic, thereby eliminating the need to interpret the complex logic of the rest of the pipeline. This significantly reduces computational complexity, enabling verification to go through quickly where, without this abstraction, it otherwise would not. For example, whenever the black boxes receive the input A, based on a simplified computational configuration, the black boxes supply the same output, such as the value D.

In another embodiment, driving block 110 may create two logic design copies of a pipeline, with results of the first copy overridden with random values by utilizing UIFs. Driving block 110 may execute the second copy once with forwarding enabled, and once without forwarding enabled.

Driving block 110 determines whether issuing of the second instruction is allowed (214). In the exemplary embodiment, driving block 110 bears responsibility for "knowing" when it may be possible to issue the second instruction to VM 104. This "knowledge" may be gleaned from design knowledge of the hardware. For example, driving block 110 may receive interface signals coming out of VM 104 when it is permissible to issue a dependent instruction. In another embodiment, driving block 110 may "know" when to issue the dependent instruction based on the type of instruction chosen to verify. For example, a multi-cycle instruction, with variable latency, may inform driving block 110 during execution (such as after two clock cycles), via the hardware, that the initial instruction will take five more clock cycles to complete. Therefore, in five clock cycles from when the hardware informs driving block 110, it will be permissible to issue the dependent instruction. In another example, a non multi-cycle instruction, with a fixed latency, may inform driving block 110 up front (prior to issuing) that the dependent instruction can be issued after "X" amount of cycles (as defined in the micro architecture).

Driving block 110 issues the same second instruction to both the reference and real hardware models (216). In the exemplary embodiment, timing of the issuing of the second instruction to both reference DUT 114 and real DUT 112 changes relative to adjustments for latency in the two logic designs. For example, driving block 110 may delay issuing the second instruction to real DUT 112 by the number of clock cycles necessary for the result of the first instruction in reference DUT 114 to become available on the register. Delaying the second instruction in real DUT 112 in such a way allows for both the second instruction of real DUT 112 and the second instruction of reference DUT 114 to be issued at the same time.

In another embodiment, the timing of driving block 110 issuing of the second instruction may not be the same for both logic design copies. For example, driving block 110 may issue the second instruction to reference DUT 114 a fixed amount of clock cycles later that it may otherwise issue the second instruction to real DUT 112. The delay in issuing the second instruction to reference DUT 114 allows the result of the first instruction of reference DUT 114 to become available in the register file.

In another embodiment, driving block 110 may issue the second instruction to real DUT 112 at the earliest possible cycle allowable by the forwarding control. For example, issuance of the second instruction to real DUT 112 may occur when the result of the first instruction of real DUT 112 becomes available on the forwarding bus.

Driving block 110 checks the register for results from both the reference and real hardware models (218). In the exemplary embodiment, driving block 110 utilizes a checker function that verifies the data on the interface from both logic design copies is the same. For example, in the context of floating point units, driving block 110 verifies data outputs, results, exception codes, condition codes, result valid indications, register files of the respective logic design copies, control signals that write to register, register file outputs, etc. In another embodiment, the checker may be a function of driving block 110, an equation comparing the outputs, two data buses, and results data of the reference and real hardware models. In another embodiment, driving block 110 may check data in the register, and when results from both reference DUT 114 and real DUT 112 are in the register, driving block 110 may compare the results.

At the end of the process, FV 108 verifies data points of one execution of the two instructions with forwarding enabled (real DUT 112) to data points of another execution of the two instructions without forwarding enabled (reference DUT 114) to verify the correctness of forwarding paths (220). In the exemplary embodiment, FV 108 verifies data points in the two logic design copies of the pipeline that behave the same, such as wires, nodes, registers, etc. In another embodiment FV 108 may, in verifying correctness of the forwarding control, verify components of VM 104 that make up a collective netlist.

Figure 3:
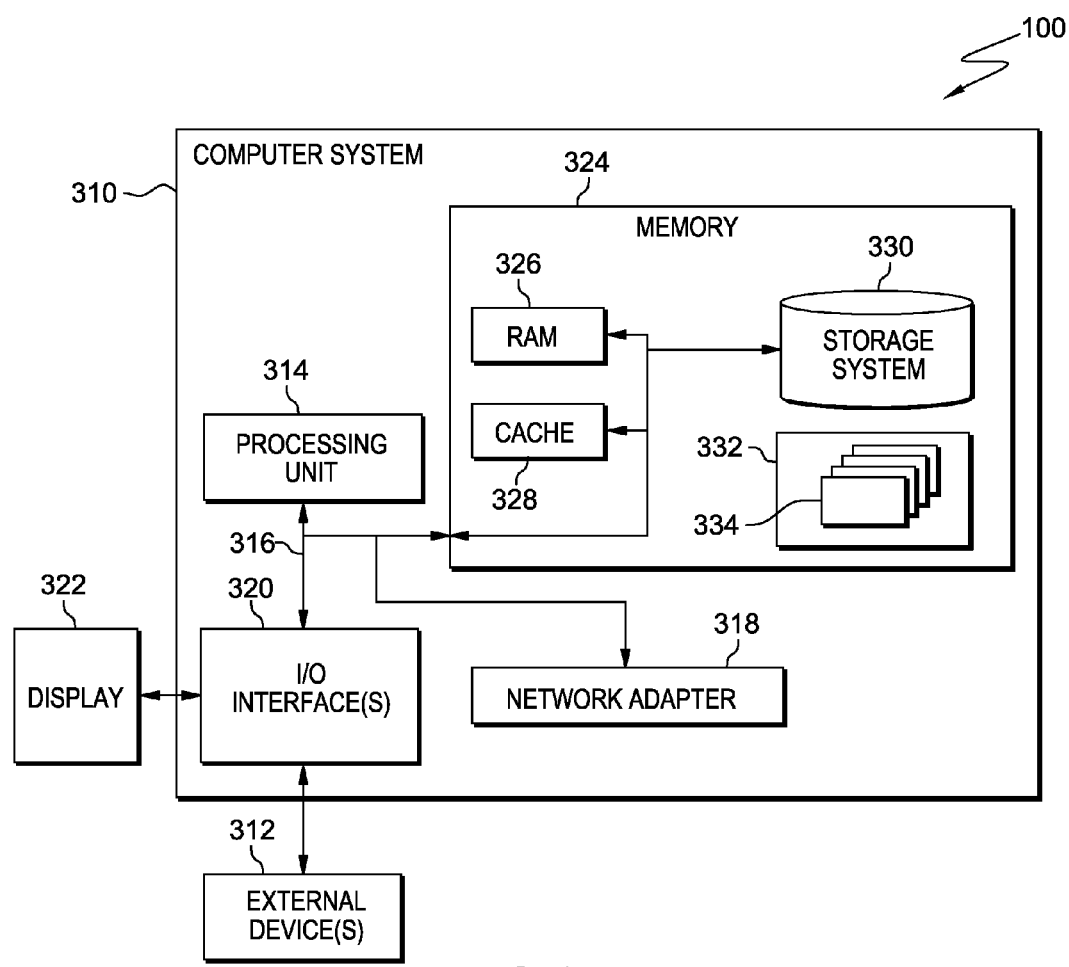
FIG. 3 is a block diagram of components of a data processing system, depicted in accordance with the present invention.

FIG. 3 depicts a block diagram of components of data processing system 100, in accordance with an illustrative embodiment of the present invention. It should be appreciated that FIG. 3 provides only an illustration of one implementation and does not imply any limitations with regard to the environments in that different embodiments may be implemented. Many modifications to the depicted environment may be made.

Computer system/server 310 in data processing system 100 is shown in the form of a general-purpose computing device. The components of computer system/server 310 may include, but are not limited to, one or more processors or processing units 314, a system memory 324, and a bus 316 that couples various system components including system memory 324 to processor 314.

Bus 316 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus.

Computer system/server 310 typically includes a variety of computer system readable media. Such media may be any available media that is accessible by computer system/server 310, and it includes both volatile/non-volatile media and removable/non-removable media.

System memory 324 can include computer system readable media in the form of volatile memory, such as random access memory (RAM) 326 and/or cache memory 328. Computer system/server 310 may further include other removable/non-removable, volatile/non-volatile computer system storage media. By way of example only, storage system 330 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk") and an optical disk drive for reading from or writing to a removable, non-volatile optical disk such as a CD-ROM, DVD-ROM or other optical media can be provided. In such instances, each can be connected to bus 316 by one or more data media interfaces. As will be further depicted and described below, system memory 324 may include at least one computer program product having a set (e.g., at least one) of program modules that are configured to carry out the functions of embodiments of the invention.

Program/utility 332, having one or more sets of program modules 334, may be stored in memory 324 by way of example and not limitation, as well as an operating system, one or more application programs, other program modules, and program data. Each of the operating systems, one or more application programs, other program modules, and program data, or some combination thereof, may include an implementation of a networking environment. Program modules 334 generally carry out the functions and/or methodologies of embodiments of the invention as described herein. Computer system/server 310 may also communicate with one or more external devices 312 such as a keyboard, a pointing device, a display 322, etc.; one or more devices that enable a user to interact with computer system/server 310; and/or any devices (e.g., network card, modem, etc.) that enable computer system/server 310 to communicate with one or more other computing devices. Such communication can occur via Input/Output (I/O) interfaces 320. Still yet, computer system/server 310 can communicate with one or more networks such as a local area network (LAN), a general wide area network (WAN), and/or a public network (e.g., the Internet) via network adapter 318. As depicted, network adapter 318 communicates with the other components of computer system/server 310 via bus 316. It should be understood that although not shown, other hardware and/or software components could be used in conjunction with computer system/server 310. Examples, include, but are not limited to: microcode, device drivers, redundant processing units, and external disk drive arrays, RAID systems, tape drives, and data archival storage systems, etc.

The flowcharts and block diagrams in the figures illustrate the architecture, functionality, and operation of possible implementations of methods and systems according to various embodiments of the present invention. In this regard, each block in the flowcharts or block diagrams may represent a module, segment, or portion of code, which comprises one or more executable instructions for implementing the specified logical functions. It should be noted that, in some alternative implementations, the functions noted in the blocks may occur out of the order noted in the figures. For example, two blocks shown in succession may, in fact, be executed substantially concurrently, or the blocks may sometimes be executed in the reverse order, or the blocks may sometimes be executed any number of steps prior to, or subsequent to, their current place in the order, depending on the functionality involved.

The terminology used herein is for the purpose of describing particular embodiments only and is not intended to be limiting of the invention. It should be appreciated that any particular nomenclature herein is used merely for convenience and thus, the invention should not be limited to use solely in any specific function identified and/or implied by such nomenclature. Furthermore, as used herein, the singular forms of "a," "an," and "the" are intended to include the plural forms as well, unless the context clearly indicates otherwise.

The description of the present invention has been presented for purposes of illustration and description, but is not intended to be exhaustive or limited to the invention in the form disclosed. Many modifications and variations will be apparent to persons of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method for verifying forwarding paths, the method comprising:
    a computer system creating a first and a second logic design copy of an instruction pipeline, wherein the first logic design copy is driven in such a way that the first logic design copy executes a selected sequence of a first instruction and a second instruction without forwarding enabled, and the second logic design copy, is driven in such a way that the second logic design copy executes the selected sequence of the first instruction and the second instruction with forwarding enabled;
    the computer system retrieving the first instruction and the second instruction, wherein the first instruction and the second instruction have been previously proven to compute a mathematically correct result when executed separately;
    the computer system abstracting data flow of the first and second logic design copies of the instruction pipeline, wherein abstracting the data flow of the first and second logic design copies includes creating a construct of a plurality of un-interpreted functions that represent every possible value that is present in the data flow, and replacing data flow logic of the first and second logic design copies of the instruction pipeline with the construct, wherein replacing includes overriding the data flow logic pertaining data logic, reducing aspects of the data flow to be analyzed to aspects related to forwarding control logic, and enabling verification of correctness of the aspects related to the forwarding control logic;
    the computer system adjusting for latency differences between issuing of the second instruction in the first logic design copy and issuing of the second instruction in the second logic design copy of the instruction pipeline, wherein adjusting for the latency differences between the issuing of the second instruction in the first logic design and issuing of the second instruction in the second logic design copies of the instruction pipeline, comprises at least one of: driving the issuance of the first instruction, to the first logic design copy, without forwarding enabled, a number of clock cycles earlier, wherein the number of clock cycles earlier is equal to the number of clock cycles gained by implementing forwarding, in the second logic design copy, with forwarding enabled; staging the result of the second instruction in the second logic design copy, with forwarding enabled, in a buffer for a fixed number of cycles, wherein the number of cycles is equal to the number of cycles required by the first logic design copy, without forwarding enabled, to write the result of the second instruction to a register; and driving the issuance of the second instruction to the first and second logic design copies in such a way that the result of the second instructions in the first logic design copy, and the result of the second instruction in the second logic design copy, are available in the register in the same cycle; and
    the computer system verifying correctness of a result of the second instruction in the first logic design copy to a result of the second instruction in the second logic design copy of the instruction pipeline.

2. The method of claim 1, wherein creating a first and a second logic design copies of the instruction pipeline, comprising the computer system defining driver input functions for issuing the first instruction and the second instruction to the first and second logic design copies of the instruction pipeline, wherein a driver issues the first instruction and the second instruction to the first and second logic design copies of the instruction pipeline accordingly.

3. The method of claim 1, further comprising at least one of:
    the computer system issuing the first instruction to the first and second logic design copies at a same time, in a same clock cycle;
    the computer system issuing the first instruction to the first logic design copy, without forwarding enabled, one or more clock cycles earlier than issuing the first instruction to the second logic design copy, with forwarding enabled;
    the computer system issuing the second instruction to the first logic design copy, without forwarding enabled, one or more clock cycles later than issuing the second instruction to the second logic design copy, with forwarding enabled;
    the computer system issuing the second instruction to the first and second logic design copies at the same time, in the same clock cycle; and
    the computer system issuing the second instruction to the second logic design copy, with forwarding enabled, at the earliest possible clock cycle allowable by an implemented forwarding.

4. The method of claim 1, further comprising at least one of:
- the computer system verifying one execution of the first and second instruction in the second logic design copy, with forwarding enabled, to one execution of the first and second instruction in the first logic design copy, without forwarding enabled;
- the computer system determining if the result of the second instruction in the first and second logic design copies are equal in both instances; and
- the computer system verifying the instruction pipeline, wherein formal verification conclusively proves correctness of all states of the instruction pipeline.

* * * * *